United States Patent [19]

Duly

[11] 4,063,167
[45] Dec. 13, 1977

[54] BLADE TIP CLEARANCE MEASURING APPARATUS

[75] Inventor: Alan R. Duly, Huntington, Conn.

[73] Assignee: AVCO Corporation, Stratford, Conn.

[21] Appl. No.: 693,493

[22] Filed: June 7, 1976

[51] Int. Cl.$^2$ ............................................. G01R 27/26
[52] U.S. Cl. ...................................... 324/61 R; 73/462
[58] Field of Search .............. 324/61 R, 61 P; 331/65;
340/246; 321/24; 73/462

[56] References Cited

U.S. PATENT DOCUMENTS

| | | | |
|---|---|---|---|
| 3,401,383 | 9/1968 | Ault | 324/61 R |
| 3,488,581 | 1/1970 | Foster | 324/61 |
| 3,504,279 | 3/1970 | Foster et al. | 324/61 |
| 3,714,561 | 1/1973 | Jaquay | 324/61 P |

OTHER PUBLICATIONS

"Capacitive Transducers" Foldvari et al., Instruments & Control Systems, Nov. 1964, vol. 37, pp. 77–84.

*Primary Examiner*—Rudolph V. Rolinec
*Assistant Examiner*—Vincent J. Sunderdick
*Attorney, Agent, or Firm*—Irwin P. Garfinkle

[57] ABSTRACT

Apparatus is disclosed for the noncontact measurement of the clearance between the blade tips of a rotating turbine and the surrounding housing. Blade tip clearance is measured by placing a capacitance probe in the housing wall. The probe consists of two metallic conductors insulated one from the other and arranged to form the plates of a capacitor. Passing of a blade tip in close proximity to the two plates of the probe changes its capacitance. Electronic circuitry measures the change in capacitance and hence the clearance between blade tip and probe. Use of a balanced type input avoids the need for a ground return path and enables the use of a long sensor cable without degradation of results.

7 Claims, 5 Drawing Figures

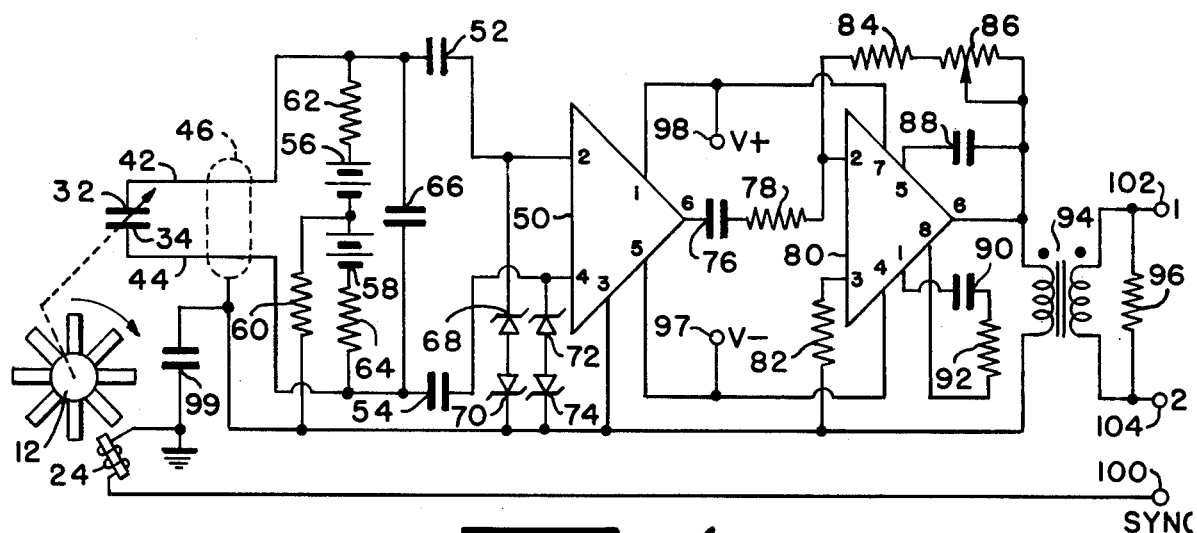
Fig 4
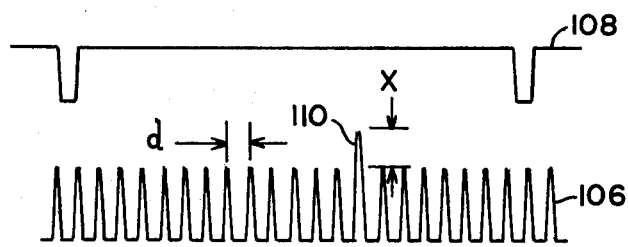
Fig 5
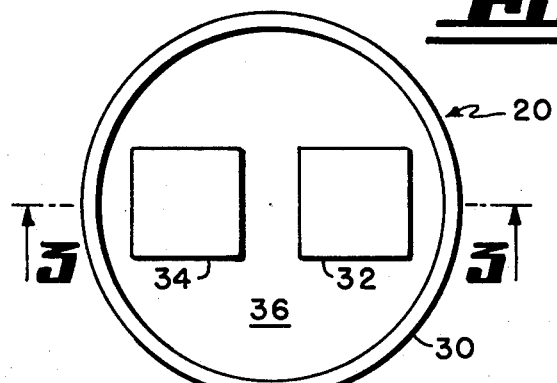
Fig 2
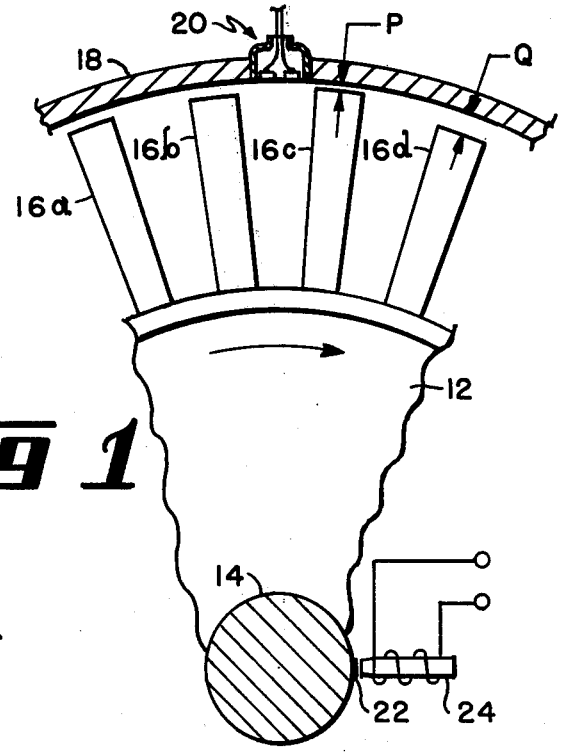
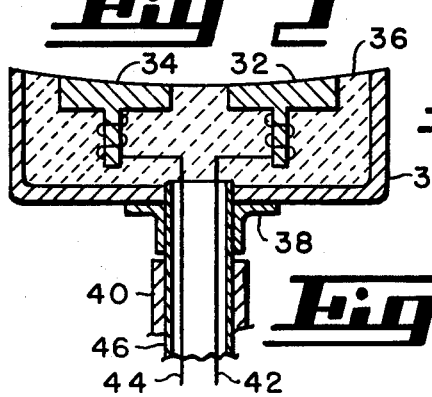
Fig 1
Fig 3

BLADE TIP CLEARANCE MEASURING APPARATUS

BACKGROUND OF THE INVENTION

This invention relates generally to an apparatus which provides an electrical analog of the separation between the tips of a set of turbine blades and the housing in which the blades rotate. A number of noncontacting inspection equipments have been developed. Examples of the equipments which have been disclosed in United States Patents are as follows: U.S. Pat. Nos. 3,504,279 of Foster, et al; 3,641,431 of Pigage; 3,467,358 of Zablotsky, et al; 3,400,331 of Harris; 3,631,430 of West; 3,386,031 of Able, et al; 3,213,360 of Cook, et al; and 3,134,445 of Hotchkiss.

Many of the above mentioned devices and equipments sense proximity by means of capacitance. In Harris (U.S. Pat. No. 3,400,331) for example a change in capacitance at the sensing probe is used to create a frequency change in an oscillator, means are then provided for displaying the change in frequency. In Pigage (U.S. Pat. No. 3,641,431) a capacitance probe measures the air gap formed between two plates, one plate being the fixed probe, the other plate being the movable cutter blade element under test. The Pigage approach requires the use of a slip ring or other low resistance contacting element between the test instrument and the unit being checked.

The apparatus of Foster, et al. (U.S. Pat. No. 3,504,279) allows non-contact inspection of multistage turbine blades in a specially instrumented fixture. There is no provision for checking blade clearance directly in the operating housing. The vibration checker of Zablotsky, et al. utilizes two non-contacting sensors for checking the amount of root-to-tip oscillation in a turbine blade.

U.S. Pats. Nos. 3,386,031 and 3,134,445 deal with systems for checking the performance of helicopter rotor blades. The first mentioned of the two (U.S. Pat. No. 3,386,031) makes use of a capacitance element in which the propeller rotor comprises one side of the capacitor and a plate probe comprises the other element. Variations in capacitance are used to change the frequency of an oscillator in a manner generally like that of Harris (U.S. Pat. No. 3,400,331). The inspection system of Hotchkiss (U.S. Pat. No. 3,134,445) is implemented by pressure sensing means.

The electronic gauging system of Cook, et al. (U.S. Pat. No. 3,213,360) utilizes a differential capacitor comprised of three coaxial cylindrical plates. Two of the plates are the same diameter and they are placed end to end with a small gap therebetween. The third plate is of smaller diameter than the others. It is axially movable and is placed within the gap between the first two plates. The two like plates of the capacitor are incorporated in the arms of a balanced bridge. Motion of the third plate unbalances the bridge.

The position responsive apparatus of West (U.S. Pat. No. 3,631,430) matches a calibrated adjustable voltage to the output voltage from a pickup device. Both capacitive and inductive potentiometers are examples of the pickup devices used by West.

None of the above have the capability provided by my invention. My invention makes use of a balanced input which avoids the need for a ground return path of doubtful integrity through rotating machinery. Further, the circuitry enables as much as 100 feet of cable between the sensor probe and the signal processor without any degradation of results.

SUMMARY OF THE INVENTION

This invention provides a means for measuring the clearance between a rotating member and the housing in which it is mounted. The apparatus includes a sensor probe, some signal processor electronics and a signal display unit. The sensor probe comprises a two electrode capacitor mounted in a holder which penetrates the housing wall immediately outboard of and in line with the tips of the blades of the turbine wheel under test. The anode and cathode eletrodes of the capacitor are arranged side by side in the inward facing portion of the probe fixture such that passage of a blade tip in close proximity thereto tends to increase the coupling of the fringe field between the two electrodes. A shielded twin lead cable conveys the signal from the sensor probe to the processor.

The electronic circuitry of the signal processor functions to detect any changes in capacitance occurring at the probe. The changes in capacitance being transferred along the shielded twin lead cable are balanced with respect to ground. This minimizes common mode noise and allows use of a long lead length cable without substantial signal degradation.

After processing the signal is displayed on a cathode ray tube. If the rotating member has a multiplicity of blades, the tip clearance of each blade with respect to the sensor probe can be determined. Use of a synchronizing signal from a shaft or hub positioned sensor allows correlation between the tip clearance displayed on the viewing screen and the positional placement or identity of the blade.

Other objects, uses and advantages of this invention will become apparent from the following description and the accompanying drawings.

BRIEF DESCRIPTION OF THE DRAWINGS

The objects and features of the invention may be better understood from the following detailed discussion taken in conjunction with the accompanying drawings in which:

FIG. 1 is a fragmentary view of a turbine wheel rotating in a housing through which a tip clearance sensor of this invention is mounted.

FIG. 2 is an end-on view of the sensor probe as seen from the turbine axis.

FIG. 3 is a cross-sectional view of a sensor probe taken along line 3 — 3 of FIG. 2.

FIG. 4 is a circuit diagram of the signal processor.

FIG. 5 is a waveform diagram of the processed signal as presented on an oscilloscope attached to the output of the FIG. 4 circuitry.

DESCRIPTION OF THE ILLUSTRATED EMBODIMENT

Referring now to FIG. 1, there is shown one stage of a turbine wheel 12 fixedly attached to an axle 14 which is mounted for rotation on bearings (not shown). A multiplicity of blades 16 extend radially outwardly from the turbine wheel. For pictorial clarity every other one of the blades 16 have been deleted. In other words there would normally be another blade between blades 16a and 16b. Surrounding turbine wheel blades 16 is housing 18. Under operating conditions, housing unit 18 must closely surround the tips of the turbine blades 16 in order to preclude leakage of fluid back upstage. Checking of these close clearances is accomplished by means of probe 20 inserted through the wall of housing 18 at the rotating centerline of blades 16.

A magnetized disk 22 can be cemented to the surface of shaft 14 at an accessible location outboard of the engine case to enable rotational sensing by magnetic pickup 24 on a once per revolution basis. The signal from magnetic pickup 24 is used in generating a sync signal.

Referring now to FIGS. 2 and 3, the sensor probe is discussed in more detail. Probe 20 includes of a case 30 which is suitable for insertion in a hole formed in housing 18. Case 30 may be cemented in place or it may be threaded on its exterior surface or it may be flanged for clamping in position. The FIG. 2 – 3 case is of the cement in place type. Within case 30 are two electrodes 32 and 34. In the unit reduced to practice, electrodes 32 and 34 were held in place by a thermal setting epoxy 36. Conductors 42 and 44 of cable 40 connect respectively two electrodes 32 and 34. The ground shield 46 of cable 40 was soldered to connector flange 38 which in turn was attached to case 30 as by soldering. Cable 40 in the unit reduced to practice was a twin lead coaxial cable.

Electrodes 32 and 34 form the plates of a capacitor. If the media around these two electrodes (in this case, epoxy 36) has a low dielectric constant, the inherent capacitance of sensor 20 is low. However, if a metallic conductor or plate is brought close to but not touching the exposed faces of electrodes 32 and 34, the capacitance increases due to the improved coupling between electrodes. This situation will prevail when one of the blades 16 of FIG. 1 passes directly in line with the electrodes of probe 20.

This change in capacitance as the tip of a turbine blade passes in line with electrodes 32 and 34 is computable as follows. Suppose a flat metal plate is brought down close to and parallel with electrodes 32 and 34 in FIG. 2. The capacitance of probe 20 is proportional to the dielectric constant (K) of the gap between the plate and electrodes 32 and 34, multiplied by the area of the faces of the electrodes (A), this result to be divided by twice the gap width (L) or $$C \propto KA/L$$

The electric charge generated by this change in capacitance is equal to the capacitance times the voltage applied across the sensor electrodes, or $$\Delta Q = \Delta C \cdot V$$

Combining the two above equations, the resulting change in charge caused by passing the tip of a turbine blade close to the electrode faces of sensor 20 is $$\Delta Q \propto (KAV)/\Delta L$$

Since $K$, $A$ and $V$ can be kept constant, we then have $\Delta Q$ is inversely proportional to $\Delta L$ FIG. 4 shows the circuit which senses the changing values of electric charge ($\Delta Q$). Electrodes 32 and 34 are shown as forming a variable capacitor under the control of rotating turbine wheel 12. Coaxial cable leads 42 and 44 couple sensor electrodes 32 and 34 to the input of a charge differential amplifier 50 via coupling capacitors 52 and 54. Voltage to charge the sensor capacitor made up of electrodes 32 and 34 comes from batteries 56 and 58 which are connected in series. The mid-voltage point between the batteries is connected via resistor 60 to shield 46 of the coaxial cable and to the common ground line of the electronic circuit.

Resistors 62 and 64 are placed in series between the battery and the sensor electrodes 32 and 34. Fixed capacitor 66 is placed in parallel with the sensor. The values of capacitor 66 and resistors 62 and 64 are chosen to provide the proper time constant for the circuit. The value of capacitor 66 will also be a function of the length of the cable connecting the sensor to the FIG. 4 electronics. This is because of the fact that coaxial cables exhibit not only a characteristic impedance but also a known amount of capacitance and inductance per unit length.

Use of the balanced circuit shown in FIG. 4 was found to provide good cancellation of stray noise pickup. Back-to-back zener diodes 68, 70, 72, and 74, connected between ground and the two input pins 2 and 4 of differential amplifier 50 provide good summing point clamping, and bypass substantially all high noise spikes to ground.

Charge differential amplifier 50 in the unit reduced to practice was a Model 35410 module produced by Endevco of Pasadena, Calif.

The output at pin 6 of amplifier 50 is a voltage wave which is proportional to the changing value of capacitance measured across electrodes 32 and 34. Operational amplifier 80 connected to the output of amplifier 50 via capacitor 76 and resistor 78 is used as an inverting AC-coupled feedback amplifier. In the manner in which amplifier 80 is connected, its cutoff frequency is approximately equal to the inverse of the quantity ($2 \pi C_{76} R_{78}$). The high frequency gain approximately equals the quantity $(R_{84} + R_{86})/(R_{78})$. Capacitor 88 is used to inject roll-off correction into balance pin 5 of operational amplifier 80. Capacitor 90 and resistor 92 connected in series between pins 1 and 5 of amplifier 80 constitute a compensating minor loop feedback network around the high gain portion of the operational amplifier. Resistor 82 establishes isolation for the plus-input pin 3 of operational amplifier 80. Transformer 94 serves to isolate the amplifier from the load. A resistor 96 is used to establish a nominal load on both transformer 94 and amplifier 80. DC power to drive both amplifiers 50 and 80 is supplied at terminals 97 and 98. Gain of amplifier 80 is made variable by potentiometer 86.

Capacitor 99 (See FIG. 4) bypasses the common line of the electronic circuit to ground.

The signal output from terminals 102 and 104 of the FIG. 4 electronics will appear as waveshape 106 (See FIG. 5) when displayed on a cathode ray tube type oscilloscope. If a dual trace oscilloscope is used the sync output 100 (See FIG. 4) will appear as waveshape 108 in FIG. 5.

In the unit reduced to practice a test setup was checked wherein the tip of one blade 16c (See FIG. 1) was formed such that it was 0.005 inch longer than its neighbors. Thus, clearance distance P was 0.005 inch less than clearance Q (See FIG. 1). When the turbine wheel was spun in the test fixture, the video display was as shown in FIG. 5. Pulse 110 is seen to extend as amount X above its neighbors in waveshape 106. Further, a count of the pulses in waveshape 106 made with respect to the sync 108 shows that the 14th blade after the sync has the too-long tip.

Placement of micrometered shim stock of various thickness on the tip of a blade allows calibration of the testing apparatus. Pulse height versus gap clearance can be determined to an accuracy of a few percent.

Checking of vibrational analysis is another application for which the apparatus has been found useful. Torsional twisting and bending of the individual blades will show up on the video display as variations in pulse spacing $d$ in FIG. 5. Bearing chatter on shaft 14 will appear as vertical oscillations of the pulse wavetrain.

It is apparent that numerous and varied arrangements may be devised in accordance with the principles described above, without departing from the spirit and scope of the invention. For example, the sensor probe could be assembled using materials which would stand up under heat. This would allow clearance tests to be made on the hot gas generator stages of an operating engine. Further, while the exemplary model was discussed with reference to checking the tip clearance of turbine blades, it will be understood by those skilled in the art that the apparatus is equally applicable for measuring the proximity of the peripheral extremities for many other types of rotating machinery. Finally, the sync signal generating method discussed above is only intended to be typical. Another method tested successfully in the evolution of my invention used reflected light from a spot of white paint applied to the rotary shaft.

I claim:

1. Apparatus for the noncontact measurement of the clearance between a rotating member and the housing in which said member is mounted, said apparatus comprising:
    a sensor probe fixedly mounted in said housing in close proximity to but not touching said rotating member, said probe consisting of two metallic conductors positioned side by side and insulated one from the other, said conductors forming the anode and cathode electrodes of a capacitor, the capacitance of said probe being a function of the proximity of said member to said electrodes;
    a source of direct current voltage connected across said electrodes, the positive voltage source being connected via a first resistor element and a first conductor lead to the anode electrode and the negative voltage source being connected via a second resistor element and a second conductor lead to the cathode electrode, said direct current voltage source being connected to common ground at its mid-voltage point;
    electronic circuit means coupled to the electrodes of said sensor probe for producing a voltage wave output, said means including a charge differential amplifier having one of its inputs coupled to said anode electrode and the second of its inputs coupled to said cathode electrode, the output of said charge differential amplifier serving as the input to an inverting AC-coupled feedback amplifier, the output of said feedback amplifier passing through an isolation transformer and serving as the signal voltage wave output of said electronic circuit means, the amplitude of said voltage wave being proportional to the changing value of capacitance measured across the electrodes of said sensor probe; and
    means for displaying the electrical analog of the separation between the sensor probe and the peripheral extremities of said rotating member.

2. The apparatus as defined in claim 1 and synchronizing means cooperating with said rotating member for generating therefrom a once per revolution voltage wave pulse, said pulse serving to positionally reference said means for displaying said clearance between said rotating member and said housing.

3. Apparatus as defined in claim 1 including calibration means for relating test measurement findings to a reference standard.

4. Apparatus as defined in claim 1 wherein the electronic circuit means includes:
    a shielded twin conductor cable for coupling said sensor probe to said electronic circuit,
    voltage supply means across said twin conductor cable for charging the electrodes of said sensor probe in proportion to the variations in the instantaneous values of capacitance, and
    a two input charge differential amplifier having its one input coupled to said anode electrode and its other input coupled to said cathode, the output of said amplifier being a voltage wave that is an electrical analog of the capacitance being measured at the sensor probe.

5. The apparatus as defined in claim 4 wherein the anode and cathode electrodes of said sensor probe are both isolated from ground, said electrodes being part of a balanced input electronic circuit.

6. The apparatus as defined in claim 1 wherein the means for displaying the electrical analog of the separation of the sensor probe and the peripheral extremities of the rotating member includes a cathode ray tube type oscilloscope, the input terminals of said oscilloscope being connected to the output terminals of the electronic circuit means.

7. The apparatus as defined in claim 1 and a case for fixedly positioning therein the electrodes of said sensor probe whereby the relative orientation of said electrodes and the electric field coupling therebetween is predetermined.

* * * * *